United States Patent
Cai et al.

(10) Patent No.: US 10,997,017 B2
(45) Date of Patent: *May 4, 2021

(54) NEIGHBOR ASSISTED CORRECTION ERROR RECOVERY FOR MEMORY SYSTEM AND METHOD THEREOF

(71) Applicant: SK hynix Inc., Gyeonggi-do (KR)

(72) Inventors: Yu Cai, San Jose, CA (US); Chenrong Xiong, San Jose, CA (US); Fan Zhang, San Jose, CA (US); Naveen Kumar, San Jose, CA (US); Aman Bhatia, San Jose, CA (US); Xuanxuan Lu, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 22 days.

This patent is subject to a terminal disclaimer.

(21) Appl. No.: 16/400,773

(22) Filed: May 1, 2019

(65) Prior Publication Data

US 2019/0340062 A1 Nov. 7, 2019

Related U.S. Application Data

(60) Provisional application No. 62/666,365, filed on May 3, 2018.

(51) Int. Cl.
*G06F 11/10* (2006.01)
*G11C 11/56* (2006.01)
(Continued)

(52) U.S. Cl.
CPC ...... *G06F 11/1004* (2013.01); *G11C 11/5642* (2013.01); *G11C 11/5671* (2013.01);
(Continued)

(58) Field of Classification Search
CPC ............. G06F 11/1004; G06F 11/1012; G06F 11/1048; G11C 11/5642; G11C 11/5671;
(Continued)

(56) References Cited

U.S. PATENT DOCUMENTS 9,059,742 B1   6/2015   Anderson et al.
9,329,935 B2 * 5/2016   Cohen ................. G06F 11/1076
(Continued)

OTHER PUBLICATIONS

"Neighbor-Cell Assisted Error Correctionfor MLC NAND Flash Memories" by Yu Cai, Gulay Yalcin, Onur Mutlu, Erich F. Haratsch, Osman Unsal, Adrian Cristal, and Ken Mai : SIGMETRICS'14, Jun. 16-20, 2014, Austin, TX, USA copyright 2014 ACM 978-1-4503-2789-3/14/06 (Year: 2014).*

(Continued)

*Primary Examiner* — Cynthia Britt
(74) *Attorney, Agent, or Firm* — IP & T Group LLP

(57) ABSTRACT

Error recovery operations are provided for a memory system. The memory system includes a memory device including a plurality of cells and a controller. The controller performs a read on a select cell among the plurality of cells. The controller adjusts a log-likelihood ratio (LLR) value on the select cell to generate an adjusted LLR value, based on first read data on the select cell and second read data on at least one neighbor cell adjacent to the select cell, when the read on the select cell fails.

20 Claims, 14 Drawing Sheets

(51) Int. Cl.
  *H03M 13/45* (2006.01)
  *G11C 16/26* (2006.01)
  *G11C 16/08* (2006.01)

(52) U.S. Cl.
  CPC .............. *G11C 16/08* (2013.01); *G11C 16/26* (2013.01); *H03M 13/45* (2013.01)

(58) Field of Classification Search
  CPC . G11C 16/26; G11C 16/08; G11C 2211/5642; G11C 16/3422; G11C 16/0483; H03M 13/45
  See application file for complete search history.

(56) References Cited

U.S. PATENT DOCUMENTS

| | | | | |
|---|---|---|---|---|
| 9,450,610 | B1* | 9/2016 | Micheloni | G06F 11/1012 |
| 2011/0311002 | A1 | 12/2011 | Li et al. | |
| 2013/0185598 | A1* | 7/2013 | Haratsch | G06F 11/1072 |
| | | | | 714/42 |
| 2014/0153332 | A1* | 6/2014 | Parthasarathy | G11C 16/26 |
| | | | | 365/185.09 |
| 2014/0281800 | A1* | 9/2014 | Micheloni | H03M 13/3927 |
| | | | | 714/759 |
| 2014/0281828 | A1* | 9/2014 | Micheloni | G06F 11/1048 |
| | | | | 714/773 |
| 2016/0266969 | A1* | 9/2016 | Jeon | G06F 11/1012 |
| 2016/0276039 | A1* | 9/2016 | Cai | G06F 11/1012 |
| 2016/0306694 | A1* | 10/2016 | Tai | H03M 13/6325 |
| 2017/0236592 | A1* | 8/2017 | Alhussien | G11C 16/3431 |
| | | | | 714/721 |
| 2018/0287635 | A1* | 10/2018 | Djurdjevic, IV | H03M 13/1111 |
| 2019/0081641 | A1* | 3/2019 | Symons | H03M 13/1125 |

OTHER PUBLICATIONS

X. Qu and L. Yin, "Non-uniform quantization scheme for the decoding of low-density parity-check codes with the sum-product algorithm," 2016 6th International Conference on Electronics Information and Emergency Communication (ICEIEC), Beijing, 2016, pp. 121-125. (Year: 2016).*

K. Le and F. Ghaffari, "On the Use of Hard-Decision LDPC Decoders on MLC NAND Flash Memory," 2018 15th International Multi-Conference on Systems, Signals & Devices (SSD), Hammamet, 2018, pp. 1453-1458. (Year: 2018).*

* cited by examiner

NEIGHBOR ASSISTED CORRECTION ERROR RECOVERY FOR MEMORY SYSTEM AND METHOD THEREOF

CROSS-REFERENCE TO RELATED APPLICATION

This application claims the benefit of U.S. Provisional Application No. 62/666,365, filed on May 3, 2018, the entire contents of which are incorporated herein by reference.

BACKGROUND

1. Field

Embodiments of the present disclosure relate to error recovery schemes for a memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces such as a universal flash storage (UFS), and solid state drives (SSDs). Memory systems may use various kinds of encoder and decoder.

SUMMARY

Aspects of the present invention provide a memory system capable of performing an error recovery operation for read data of a certain cell using data of neighbor cells and a method thereof.

In one aspect, a memory system includes a memory device including a plurality of cells and a controller. The controller performs a read on a select cell among the plurality of cells. The controller adjusts a log-likelihood ratio (LLR) value on the select cell to generate an adjusted LLR value, based on first read data on the select cell and second read data on at least one neighbor cell adjacent to the select cell, when the read on the select cell fails.

In another aspect, a method for operating a memory system including a memory device having a plurality of cells and a controller: performing a read on a select cell among the plurality of cells; and when the read on the select cell fails, adjusting a log-likelihood ratio (LLR) value on the select cell to generate an adjusted LLR value, based on first read data on the select cell and second read data on at least one neighbor cell adjacent to the select cell.

Additional aspects of the present invention will become apparent from the following description.

DETAILED DESCRIPTION

Figure 1:
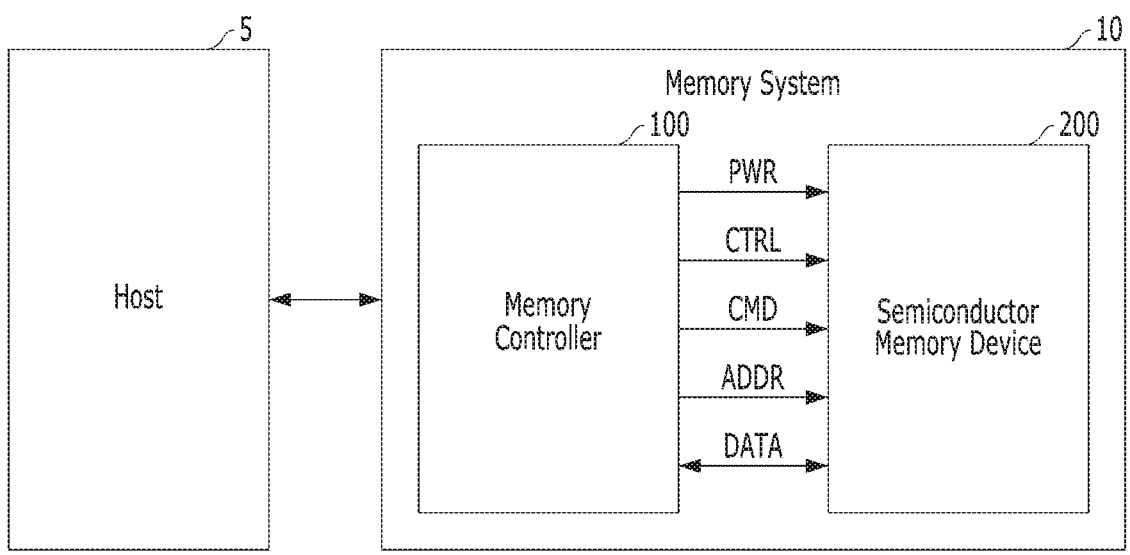
FIG. 1 is a block diagram illustrating a data processing system in accordance with an embodiment of the present invention.

Various embodiments are described below in more detail with reference to the accompanying drawings. The present invention may, however be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram illustrating a data processing system 2 in accordance with an embodiment of the present invention.

Referring FIG. 1, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any one of various kinds of electronic devices. In various embodiments, the host device 5 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may include a portable electronic device such as a mobile phone, a smart phone, an e-book, an MP3 player, a portable multimedia player (PMP), and/or a portable game player.

The memory system 10 may be implemented with any one of various kinds of storage devices such as a solid state drive (SSD) and a memory card. In various embodiments, the memory system 10 may be provided as one of various components in an electronic device such as a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal CTRL may include a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Figure 2:
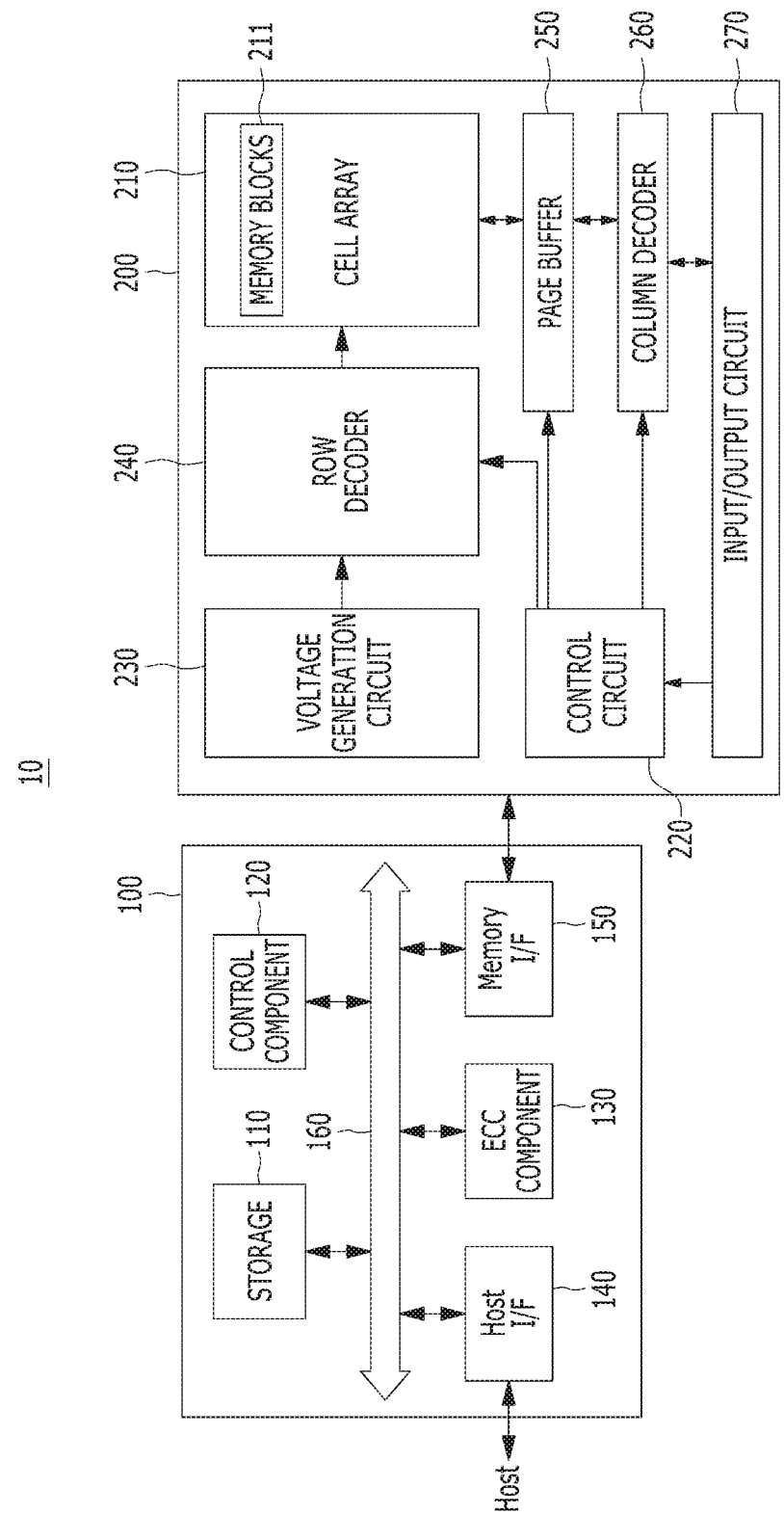
FIG. 2 is a block diagram illustrating a memory system in accordance with an embodiment of the present invention.

FIG. 2 is a block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device (e.g., host device 5 of FIG. 1), and in particular, store data to be accessed by the host device.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In various embodiments, the ECC component 130 may perform an error correction operation based on a coded modulation such as a low density parity check (LDDC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices for suitable error correction operation.

The host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250, which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
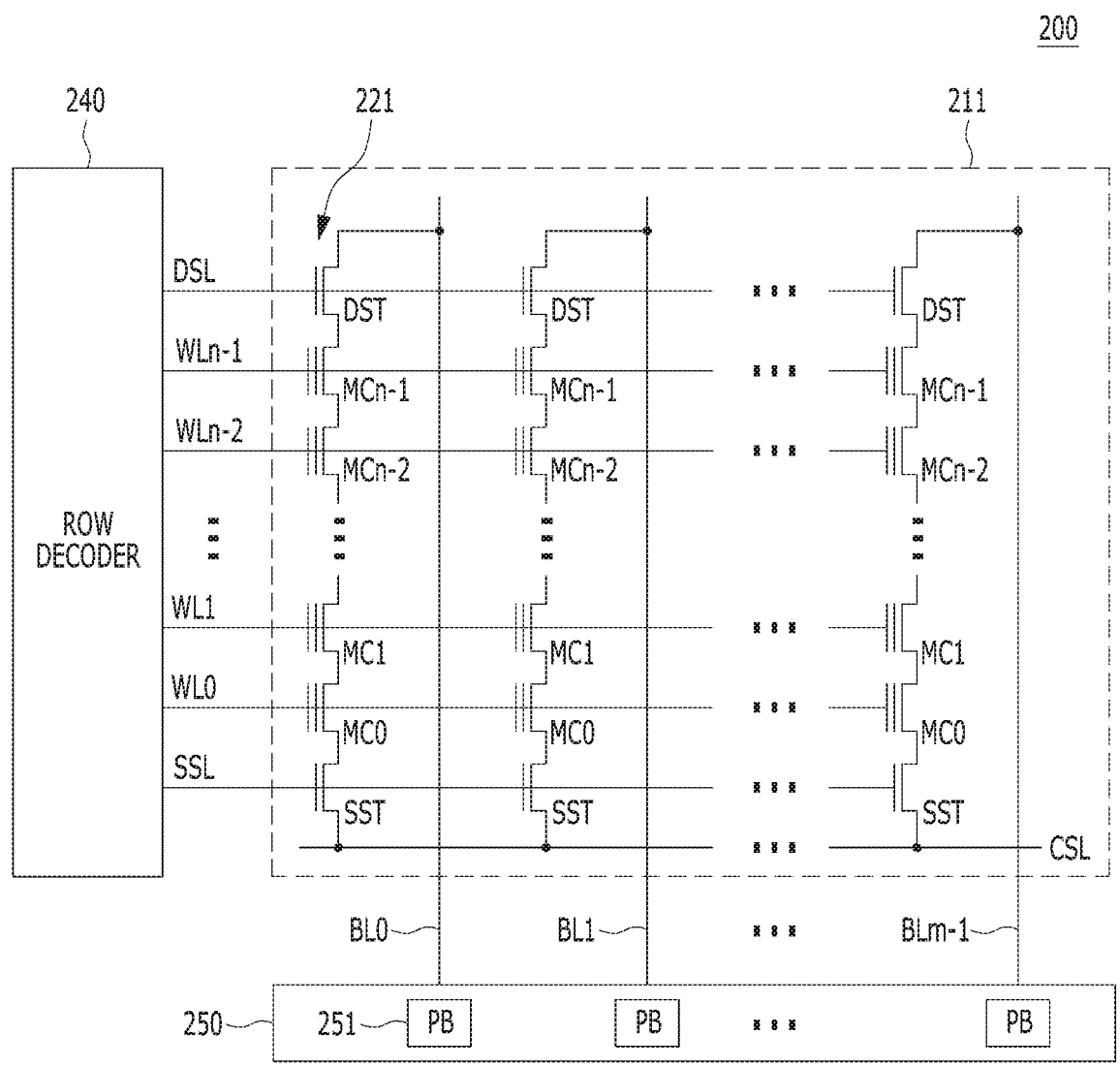
FIG. 3 is a circuit diagram illustrating a memory block of a memory device in accordance with an embodiment of the present invention.

The page buffer 250 may be coupled with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or transmit and receive data to and from the input/output circuit 270.

The input/output circuit 270 may transmit to the control circuit 220 a command and an address, received from an external device (e.g., the memory controller 100 of FIG. 1), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the exemplary memory block 211 may include a plurality of word lines WL0 to WLn-1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to 1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn-1 may be serially coupled between the selection transistors DST and SST. Each of the memory cells may be formed as a single level cell (SLC) storing 1 bit of data. Each of the memory cells may be formed as a multi-level cell (MLC) storing 2 bits of data. Each of the memory cells may be formed as a triple-level cell (TLC) storing 3 bits of data. Each of the memory cells may be formed as a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm−1. The page buffers 251 may operate in response to page buffer control signals. For example, the page buffers 251 may temporarily store data received through the bit lines BL0 to BLm−1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Memory devices such as a flash memory may store multiple bits per cell by modulating the cell into different states or voltage levels using a programming operation.

Figure 4A:
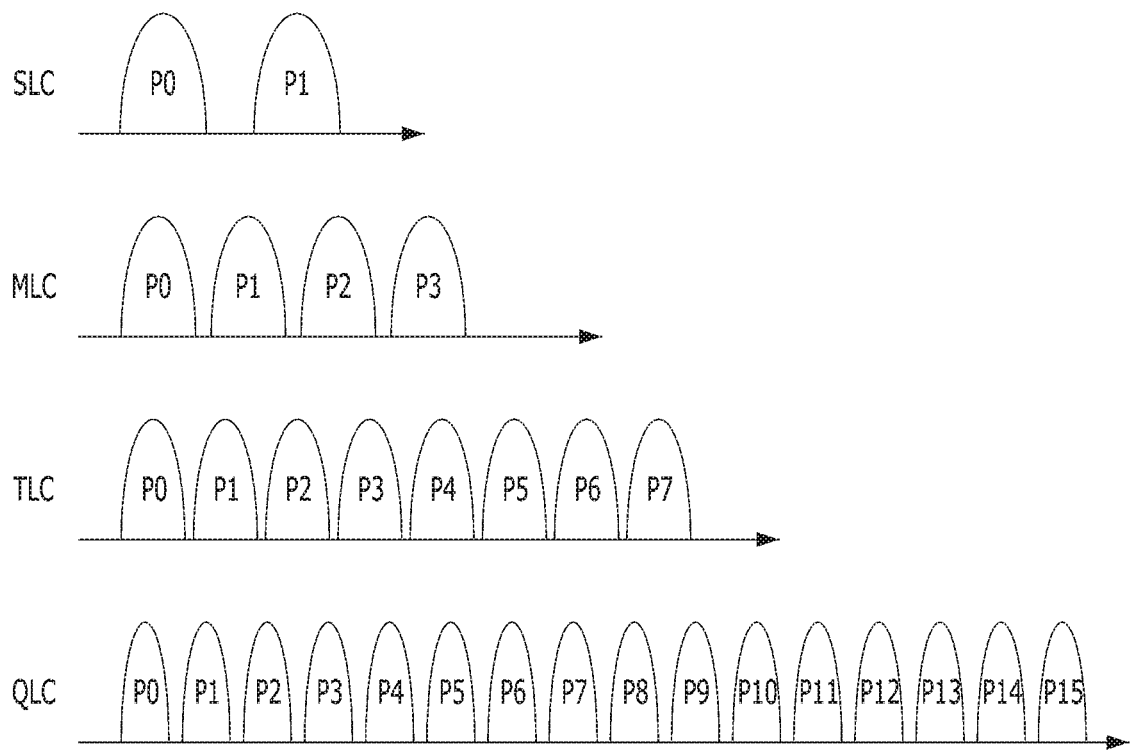
FIGS. 4A to 4C are diagrams illustrating distributions of states for cells of a memory device.
Figure 4B:
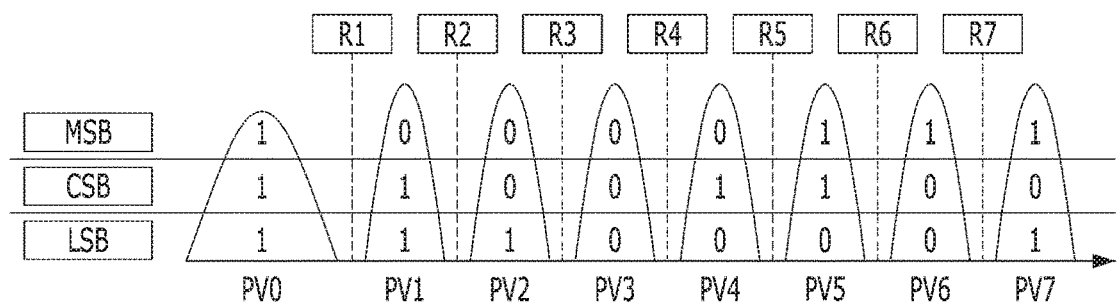

FIGS. 4A and 4B are diagrams illustrating distributions of program states or voltage (PV) levels for different types of cells of a memory device.

Referring to FIG. 4A, each of memory cells of the memory blocks may be implemented with a single level cell (SLC) storing 1 bit of data, a multi-level cell (MLC) storing 2 bits of data, a triple-level cell (TLC) storing 3 bits of data, or a quadruple-level cell (QLC) storing 4 bits of data.

Memory cells of SLC may include two states P0 and P1. P0 may indicate an erase state, and P1 may indicate a program state. Since the memory cells of SLC can be set in one of two different states, each of the memory cells may program or store 1 bit according to a set coding method. Memory cells of MLC may include four states P0, P1, P2 and P3. Among these states, P0 may indicate an erase state, and P1 to P3 may indicate program states. Since the memory cells of MLC can be set in one of four different states, each of the memory cells may program or store two bits according to a set coding method. Memory cells of TLC may include eight states P0 to P7. Among these states, P0 may indicate an erase state, and P1 to P7 may indicate program states. Since the memory cells of TLC can be set in one of eight different states, each of the memory cells may program or store three bits according to a set coding method. Memory cells of QLC may include 16 states P0 to P15. Among these states, P0 may indicate an erase state, and P1 to P15 may indicate program states. Since the memory cells of QLC can be set in one of sixteen different states, each of the memory cells may program or store four bits according to a set coding method.

Referring to FIG. 4B, for the TLC flash memory device, each of cells may have 8 states and PV levels PV0 to PV7. Each of states is defined by a unique 3-bit tuple. The first, second and third bits of the cells are grouped together into least significant bit (LSB), center significant bit (CSB) and most significant bit (MSB) pages, respectively.

Figure 4C:
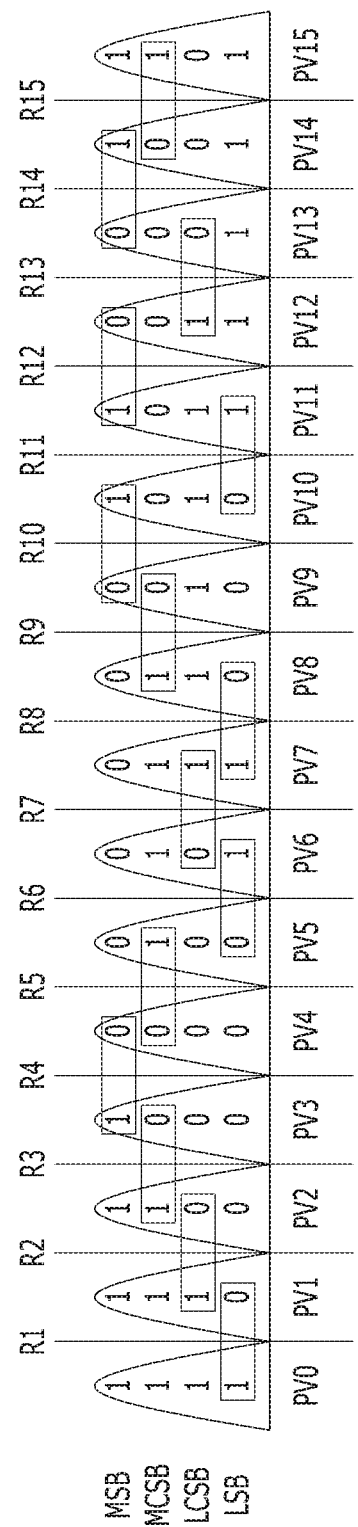

Referring to FIG. 4C, for the QLC flash memory device, each of cells may have 16 states and PV levels PV0 to PV15. Each of states is defined by a unique 4-bit tuple. The first, second, third and fourth bits of the cells are grouped together into least significant bit (LSB), least center significant bit (LCSB), most center significant bit (MCSB) and most significant bit (MSB) pages, respectively.

Figure 5A:
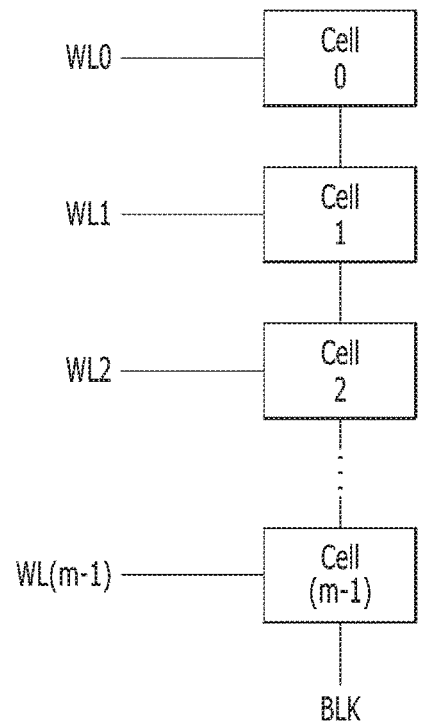
FIGS. 5A and 5B are diagrams illustrating a plurality of memory cells in a memory device.
Figure 5B:
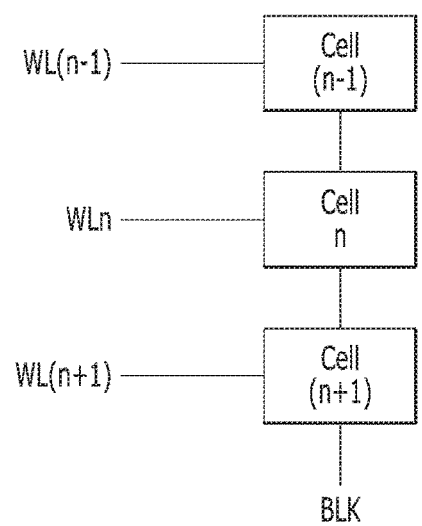

FIGS. 5A and 5B are diagrams illustrating a plurality of memory cells in a memory device.

Referring to FIG. 5A, the memory device may include a plurality of memory cells: Cell 0 to Cell (m−1), which share a bit line BLk. Each of the memory cells is coupled to a corresponding word line. For example, the memory cell Cell 0 is formed at the intersection of a word line WL0 and the bit line BLk. The memory cell Cell 1 is formed at the intersection of a word line WL1 and the bit line BLk. The memory cell Cell 2 is formed at the intersection of a word line WL2 and the bit line BLk. The memory cell Cell (m−1) is formed at the intersection of a word line WL(m−1) and the bit line BLk.

Referring to FIG. 5B, memory cells Cell (n−1), Cell (n) and Cell (n+1) share a bit line BLk and are coupled to respective word lines. For example, the memory cell Cell (n−1) is formed at the intersection of a word line WL(n−1) and the bit line BLk. The memory cell Cell (n) is formed at the intersection of a word line WLn and the bit line BLk. The memory cell Cell (n+1) is formed at the intersection of a word line WL(n+1) and the bit line BLk. When the memory cell Cell (n) is a target cell for a read operation, the upper memory cell Cell (n−1) and the lower memory cell Cell (n+1) may be neighbor cells adjacent to the memory cell Cell (n).

When a select cell (e.g., Cell (n)) of memory cells is programmed, the select cell is influenced by neighbor or adjacent cells (e.g., Cell (n−1) and Cell (n+1)). For example, different PV levels on the neighbor cells usually have different noise variances that affect the select cell (i.e., victim cell), which increases the probability that data from the victim cell will be read incorrectly. The probability that data will be incorrectly read from the victim cell may be significantly increased in cases where values (or levels) of the victim and neighbor cells form certain patterns as shown in FIG. 6.

Figure 6:
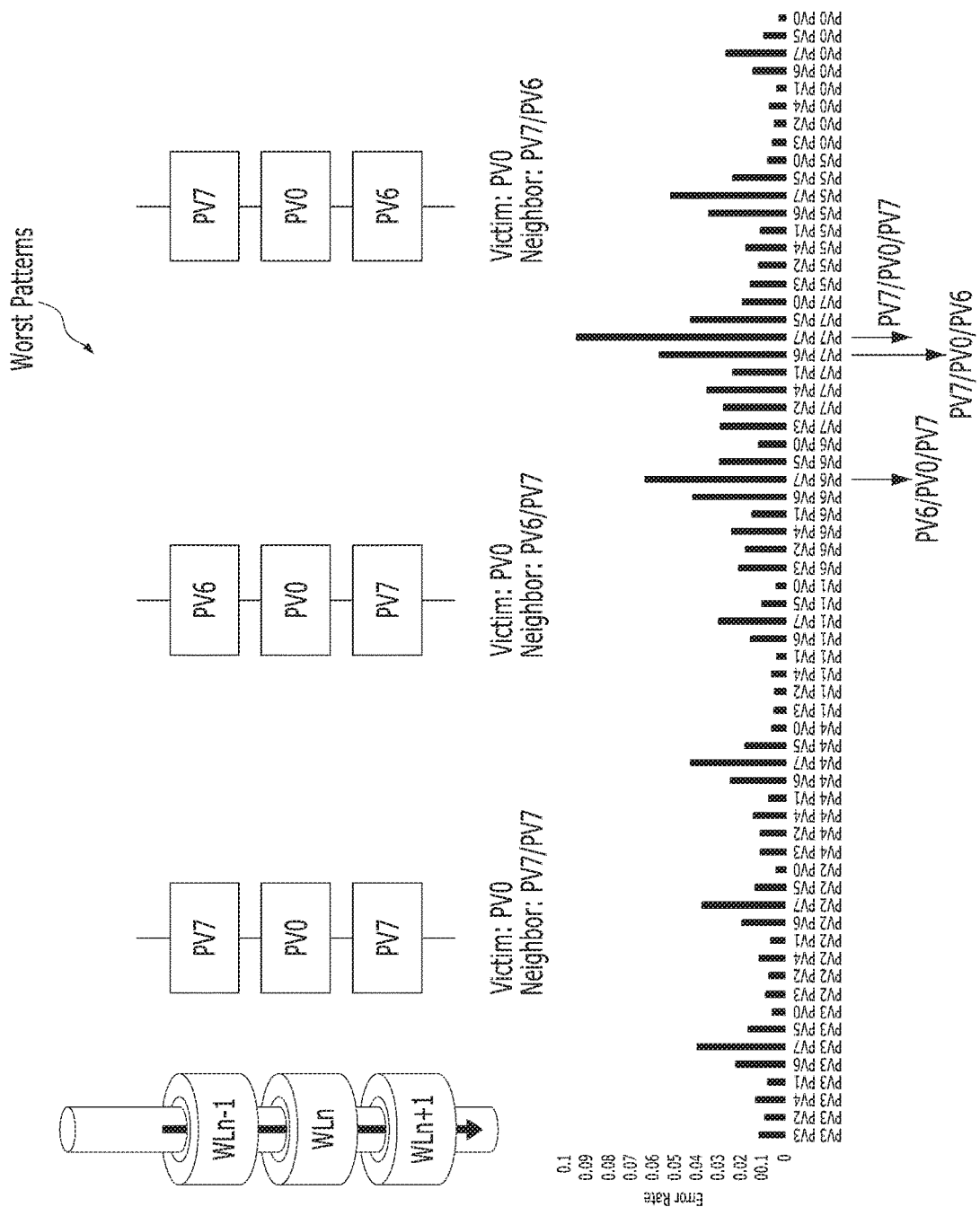
FIG. 6 is a diagram illustrating error rates of memory cells in a memory device.

Referring to FIG. 6, when memory cells coupled to each of word lines WL(n−1) to WL(n+1) have triple-level cells (TLCs), each of the memory cells may have 8 possible values as shown in FIG. 4B. For a victim cell having a certain PV value, one of the neighbor cells has one of eight possible PV values and the other neighbor cell also has one of eight possible PV values. Therefore, there is a total of 8×8=64 possible combinations of PV values of the neighbor cells. When neighbor cells have a certain pattern, an error rate of a victim cell will be significantly increased. For example, when the victim cell has a value of PV0 (i.e., an erase state or a low program state) and neighbor cells have values of PV6 or PV7 (i.e., a high program state), it has been determined by the inventors that an error rate of the victim cell will be significantly increased. In FIG. 6, the worst patterns are PV7-PV0-PV7, PV6-PV0-PV7 and PV7-PV0-PV6, which result in an error rate that is 10 times greater than the error rate resulting from other data patterns. In other words, when the PV state pattern of victim cell and upper and lower neighbor cells is that the victim cell is in the erase state and each neighbor cell is programmed in a high program state, the victim cell has much higher read error rate than other patterns. Therefore, it is desirable to provide a scheme capable of improving error recovery capability of a victim cell using a data pattern of neighbor cells adjacent to the victim cell or a data pattern of the victim and neighbor cells.

Figure 7:
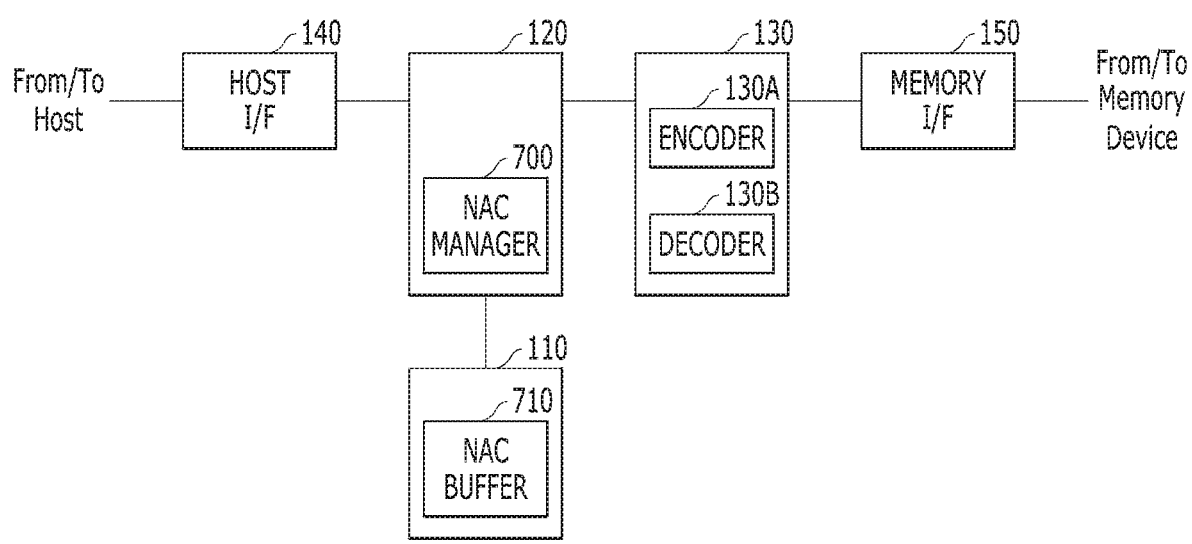
FIG. 7 is a diagram illustrating a controller in accordance with an embodiment of the present invention.

FIG. 7 is a diagram illustrating a controller in accordance with an embodiment of the present invention. For example, the controller of FIG. 7 may depict the controller 100 shown in FIG. 2. The controller 100 and the memory device 200 may perform the operations described in FIGS. 1 and 2.

Referring to FIG. 7, the controller 100 may include a storage 110, a control component 120, an error correction code (ECC) component 130, a host interface (I/F) 140, a memory interface (I/F) 150, as shown in FIG. 2. Further, the control component 120 may include a neighbour assisted correction (NAC) manager 700, the storage 110 may include a NAC buffer 710, and the ECC component 130 may include an encoder 130A and a decoder 130B.

The controller 100 may receive a command from a host through the host interface 140 and provide a memory device (e.g., the memory device 200 of FIG. 2) with the received command through the memory interface 150. For example, the controller 100 receives a write command and write data corresponding to the write command, and controls the memory device 200 to perform a program operation on the write data. For another example, the controller 100 receives a read command, and controls the memory device 200 to perform a read operation on data corresponding to the read command. The controller 100 transmits read data corresponding to the read command to the host.

The memory device 200 may include a NAND-type flash memory device with memory cells such as single-level cells (SLCs), multi-level cells (MLCs), triple-level cells (TLCs) or quadruple-level cells (QLCs). In various embodiments, the memory device 200 may include a NAND-type flash memory device with QLC memory cells (i.e., QLCs).

During the program operation, the encoder 130A may perform an encoding operation on the write data based on a set encoding scheme. During the read operation, the decoder 130B may perform a decoding operation on the read data based on a set decoding scheme corresponding to the encoding scheme. The encoder 130A and decoder 130B may be implemented by hardware, software, firmware, or any suitable combination thereof.

The NAC manager 700 may perform a NAC operation. The NAC operation may include an error correction (or recovery) operation on a read failure of a victim cell, using data of neighbor cells adjacent to the victim cell. The storage 110 may include a NAC buffer 710 for storing data of neighbor cells. In various embodiments, the NAC manager 700 may trigger the NAC operation based on the flow shown in FIG. 8. In various embodiments, the NAC manager 700 may perform the NAC operation, which is described with reference to FIGS. 9 to 12.

Figure 8:
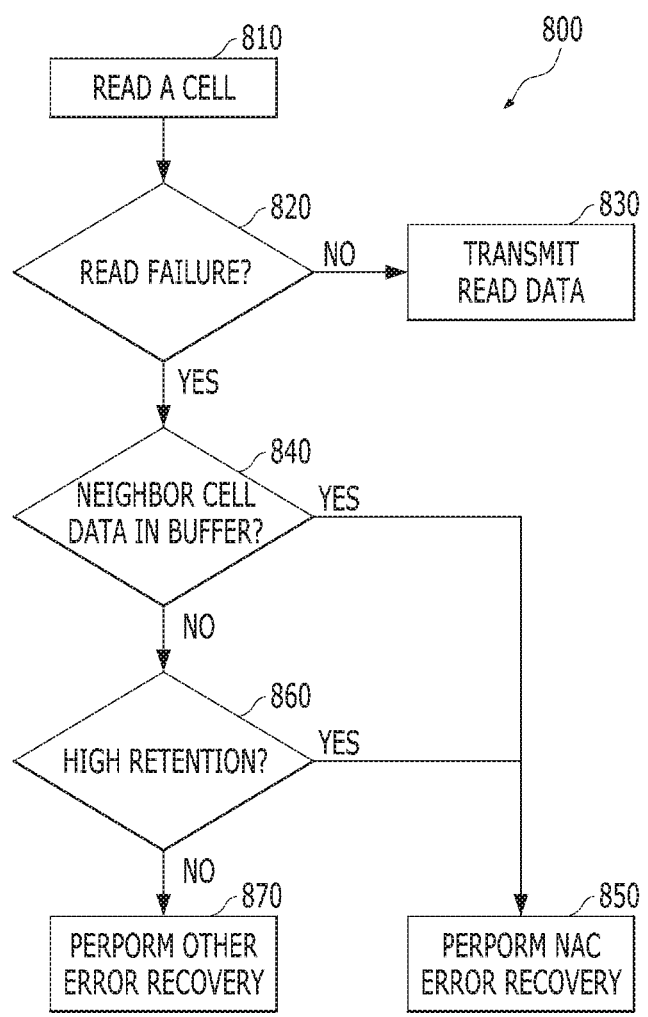
FIG. 8 is a flowchart illustrating a read error recovery operation in accordance with an embodiment of the present invention.

FIG. 8 is a flowchart illustrating a read error recovery operation 800 in accordance with an embodiment of the present invention. For example, the operation 800 of FIG. 8 may be performed by the control component 120 of the controller 100 shown in FIG. 7.

Referring to FIG. 8, at step 810, the control component 120 may perform a read operation on a select cell (i.e., victim cell) among a plurality of memory cells in a memory device (e.g., the memory device 200 of FIG. 2). At step 820, the control component 120 may determine whether a read failure on the victim cell occurs based on the decoding result of the decoder 130B.

When it is determined that no read failure occurred on the victim cell (step 820, NO), at step 830, the control component 120 may transmit read data on the victim cell to a host (e.g., the host 5 of FIG. 1).

When it is determined that the read failure on the victim cell occurred (step 820, YES), at step 840, the control component 120 may determine whether data of neighbor cells (i.e., neighbor cell data) adjacent to the victim cell is stored in a buffer (e.g., the NAC buffer 710 of FIG. 2). When it is determined that the neighbor cell data is stored in the NAC buffer 710 (step 840, YES), the control component 120 may proceed to step 850. At step 850, the control component 120 may trigger a NAC manager (e.g., the NAC manager 700 of FIG. 7) to perform a NAC error recovery operation.

For a single read scheme, the NAC error recovery operation reads neighbor cells (or word lines) a few times (e.g., 3 or 6 reads for TLC, 4 or 8 reads for QLC). Thus, the latency may increase as a result of the recovery operation. For a sequential read scheme, data of neighbor cells might already exist in the buffer due to the way sequential reads are performed. If it is determined that data of neighbor cells is already stored in the buffer (step 840), the NAC error recovery operation may be performed without increasing read latency.

When it is determined that the neighbor cell data is not stored in the NAC buffer 710 (step 840, NO), at step 860, the control component 120 may determine whether a retention time of the data on the victim cell is high. If the retention time is greater than a given retention time threshold, the retention time is considered as a high retention time. Alternatively, the control component 120 may determine whether 1→0 error is high. For example, for a triple-level cell (TLC) as shown in FIG. 4B, the 1→0 error may represent an error that occurs when a state of a memory cell changes from level PV0 (i.e., an erased state) to level PV1 (i.e., a first program state).

When it is determined that the retention time of the data on the victim cell is high (step 860, YES), at step 850, the control component 120 may trigger the NAC manager 700 to perform the NAC error recovery operation. When it is determined that the retention time of the data on the victim cell is not high (step 860, NO), at step 870, the control component 120 may perform other error recovery operation. For example, the other error recovery operation may include a soft decoding operation based on a low density parity check (LDPC) code when a hard decoding operation based on the LDPC code fails. For another example, the other error recovery operation may include a chipkill operation when a soft decoding operation based on the LDPC code fails.

As such, whenever there is a read failure, a determination is made as to whether the NAC error recovery is triggered or not, based on the determination results at steps 840 and 860.

Figure 9:
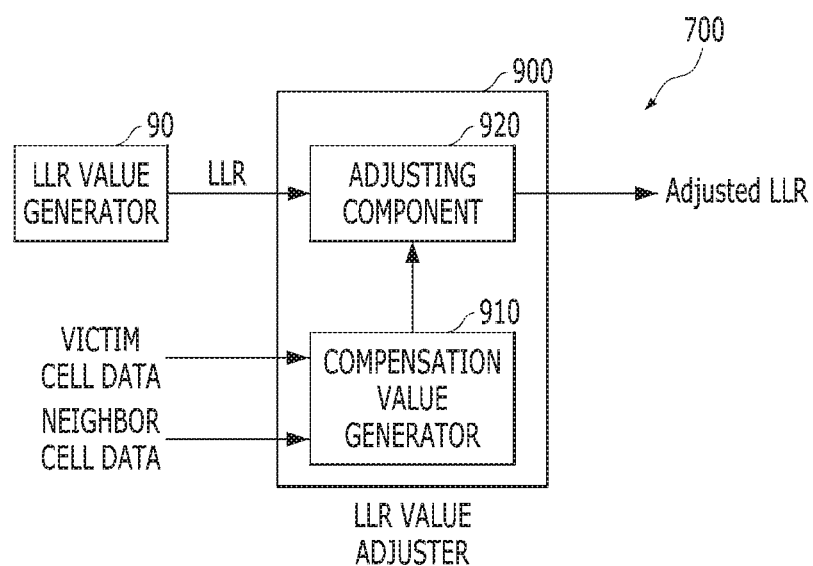
FIG. 9 is a diagram illustrating a neighbor assisted correction (NAC) manager in accordance with an embodiment of the present invention.

FIG. 9 is a diagram illustrating a neighbor assisted correction (NAC) manager in accordance with an embodiment of the present invention. For example, the NAC manager of FIG. 9 may depict the NAC manager 700 of the control component 120 in FIG. 7. The control component 120 may perform a read on a select cell (i.e., victim cell) on among a plurality of cells of a memory device (e.g., the memory device of FIG. 2). Further, when the read on the victim cell fails, the control component 120 may control the NAC manager 700 to perform a NAC error recovery operation.

Figure 10:
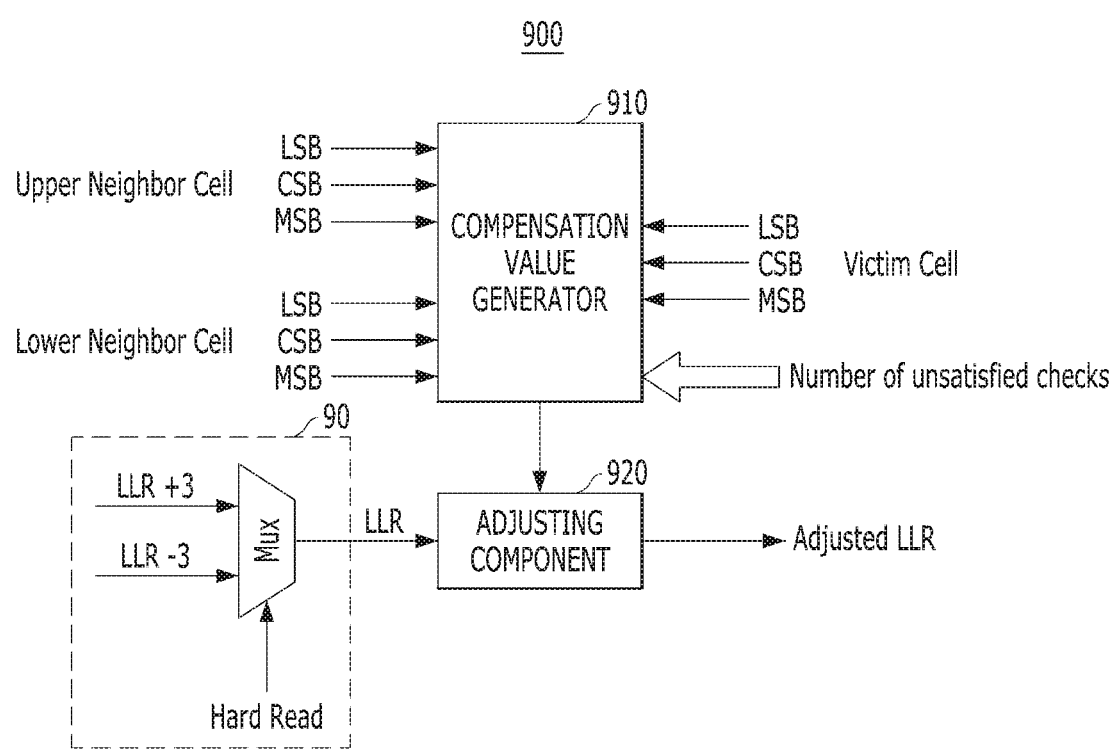
FIG. 10 is a diagram illustrating a log-likelihood ratio (LLR) value generator and an LLR value adjuster in accordance with an embodiment of the present invention.
Figure 11:
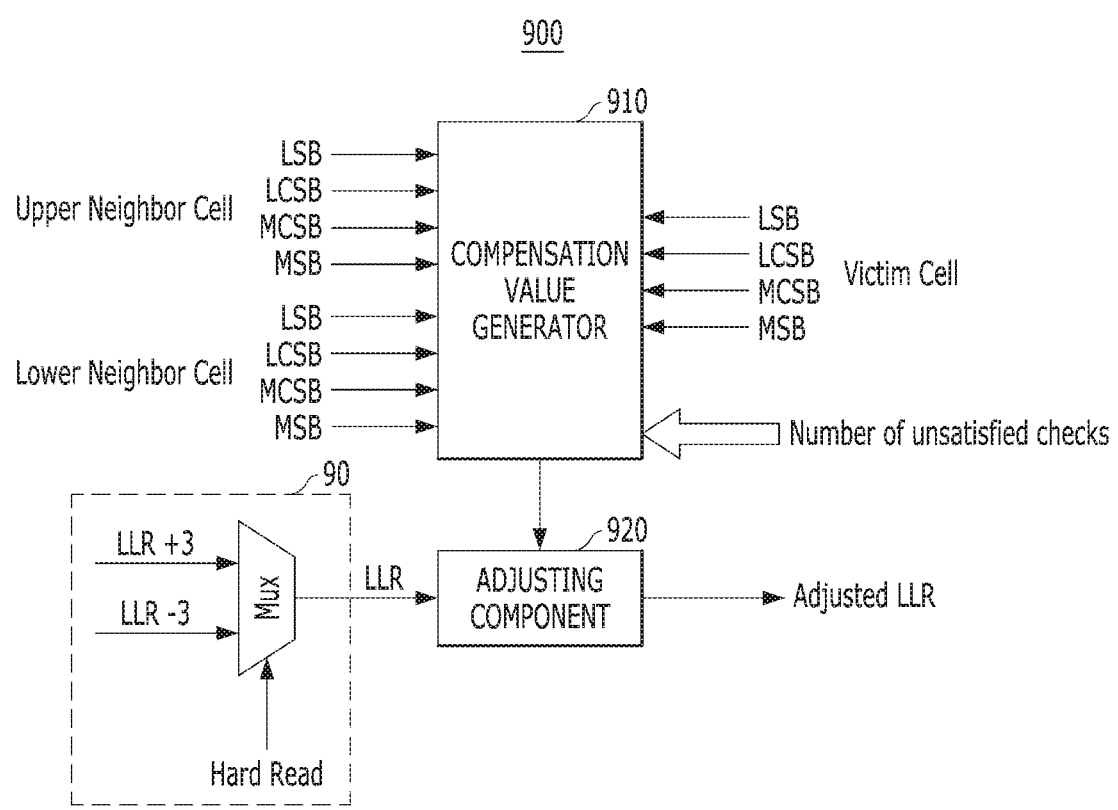
FIG. 11 is a diagram illustrating a log-likelihood ratio (LLR) value generator and an LLR value adjuster in accordance with an embodiment of the present invention.

Referring to FIG. 9, the NAC manager 700 may include a log-likelihood ratio (LLR) value generator 90 and an LLR value adjuster 900. The LLR value adjuster 900 may include a compensation value generator 910 and an adjusting component suitable 920. The LLR value generator 90, the compensation value generator 910 and the adjusting component suitable 920 may be implemented as shown FIGS. 10 and 11. FIG. 10 illustrates an example of the NAC manager 700 implemented for a memory device including triple-level cells (TLCs), while FIG. 11 illustrates an example of the NAC manager 700 implemented for a memory device including quadruple-level cells (QLCs).

The LLR value generator 90 may generate an LLR value on the victim cell. Although FIG. 9 illustrates that the NAC manager 700 includes the LLR value generator 90, the LLR value generator 90 may be implemented as a component of the decoder 130B in FIG. 7. As shown in FIGS. 10 and 11, the LLR value generator 90 may include a multiplexer (Mux) for selecting an LLR value "+3" or "−3" based on a hard decision result on read data of the victim cell.

The compensation value generator 910 may receive data on the victim cell referred to as victim cell data or first read data, and receive data on neighbor cell(s) referred to as neighbor cell data or second read data. In an example of FIG. 10, the victim cell data may include 3 bits of data corresponding to LSB, CSB, MSB pages on victim cells, and the neighbor cell data of each neighbor cell may include 3 bits of data corresponding to LSB, CSB, MSB pages. In an example of FIG. 11, the victim cell data may include 4 bits of data corresponding to LSB, LCSB, MCSB, MSB pages on victim cells, and the neighbor cell data of each neighbor cell may include 4 bits of data corresponding to LSB, LCSB, MCSB, MSB pages. The neighbor cells may be upper and lower neighbor cells.

The compensation value generator 910 may generate a compensation value based on a data pattern of the victim cell data and the neighbor cell data. For example, the data pattern may include one of bad patterns such as PV7/PV0/PV7, PV6/PV0/PV7, PV7/PV0/PV6 (where PV0 is a level corresponding to the victim cell data, and PV6 and PV7 are levels corresponding to the neighbor cell data), as shown in FIG. 6.

The adjusting component 920 may receive the value of the LLR, and adjust the value of the LLR based on the compensation value to generate an adjusted LLR value. The control component 120 may control the decoder 130B to perform a decoding operation on the victim cell data using the adjusted LLR value. In other words, the control component 120 may perform the NAC error recovery operation on the victim cell data using the adjusted LLR value.

In various embodiments, the adjusting component 920 may generate the adjusted LLR value by changing the value of the LLR by the compensation value (e.g., adding the compensation value to the LLR value). For bad patterns above described, the adjusting component 920 reduces the value of the LLR. If the value of the original LLR is "+3" and the compensation value is "−2", the adjusted LLR value may be "+1". If the value of the original LLR is "+3" and the compensation value is "−4", the adjusted LLR value may be "−1". Alternatively, the adjusting component 920 changes the sign of the LLR value by flipping the LLR value. For example, when the original LLR is "+3", the adjusted LLR value could be "−3" by flipping the sign of the LLR. For benign patterns (e.g., PV0/PV0/PV0), the compensation value generator 910 generates the compensation value "0" to keep the LLR value unchanged.

In various embodiments, the adjusting component 920 may generate the adjusted LLR value by scaling the value of the LLR by multiplying the LLR value by the compensation value. For bad patterns described above, the adjusting component 920 multiplies the LLR value by the compensation value to generate the adjusted LLR value. If the LLR value is "+3" and the compensation value is 0.7 (i.e., a number less than 1), the adjusted LLR value may be "+2", which is (3*0.7) rounded to the nearest whole number. In other words, for bad patterns, the adjusting component 920 weakens the confidence of the LLR value. For benign patterns, the compensation value generator 910 generates the compensation value "1" to keep the LLR value unchanged.

Although examples of FIGS. 10 and 11 illustrate that the LLR value adjuster 900 receives data on both upper and lower neighbor cells, the LLR value adjuster 900 may receive data on one or the other of the upper and lower neighbor cells. In other words, the LLR value adjuster 900 may determine adjusting of LLR value on data of victim cell, based on data on one of upper and lower neighbor cells.

Alternatively, the above LLR compensation or adjusting of FIGS. 9 to 11 may be also controlled by the number of unsatisfied checks connected to each bit of data (see FIGS. 10 and 11). For example, if the number of unsatisfied checks is greater than a threshold value, the LLR value adjuster 900 may adjust LLR value. This kind of threshold may be determined based on Monte Carlo simulation. In various embodiments, the LLR value adjuster 900 may tune the amount of compensation by which the LLR value is adjusted based on the number of unsatisfied checks. For example, it is assumed that the threshold value is 300 and the original LLR value is "+3". If the number of unsatisfied checks is greater than 500 (i.e., the number of unsatisfied checks >500), the compensation value could be "−3" and the compensated LLR is "0". When the number of unsatisfied checks is less than 500 and is greater than 300 (i.e., 500>the number of unsatisfied checks >300, the compensation value is "−1" and the compensated LLR is "+2". Even for a bad pattern, if all its connected checks are satisfied (i.e., the number of unsatisfied checks is less than the threshold value), the LLR value adjuster 900 may not adjust the LLR value of the victim cell.

Figure 12:
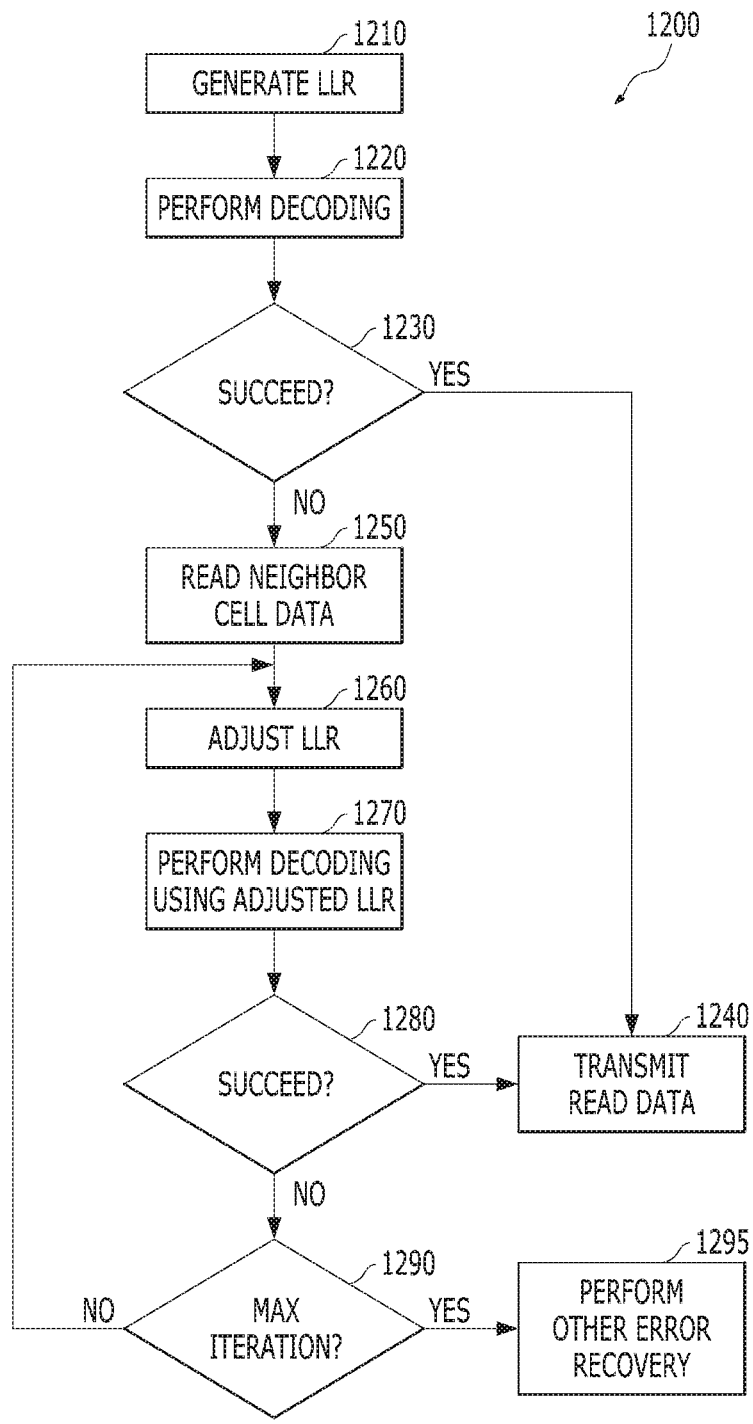
FIG. 12 is a flowchart illustrating a read error recovery operation based on an adjusting operation of a log-likelihood ratio (LLR) value in accordance with an embodiment of the present invention.

FIG. 12 is a flowchart illustrating a read error recovery operation 1200 based on an adjusting operation of a log-likelihood ratio (LLR) value in accordance with an embodiment of the present invention. For example, the operation 1200 of FIG. 12 may be performed by the controller 100 shown in FIGS. 7 to 11.

Referring to FIG. 12, at step 1210, the controller 100 may control the memory device 200 to perform a read operation on a victim cell. Further, the controller 100 may generate an LLR value on read data of the victim cell.

At step 1220, the controller 100 may perform a decoding operation using the LLR value. For example, the controller 100 may perform a low density parity check (LDPC) decoding operation using the LLR value.

At step 1230, the controller 100 may determine whether the decoding operation succeeded or failed. If it is determined that the decoding operation succeeded (1230, YES), the controller 100 may proceed to step 1240. If not (1230, NO), the controller 100 may proceed to step 1250.

At step 1250, the controller 100 may control the memory device 200 to perform a read operation on at least one neighbor cell adjacent to the victim cell. At step 1260, the controller 100 may adjust the LLR value of the victim cell to generate an adjusted LLR value. In various embodiments, the controller 100 may generate a compensation value based on a pattern of the victim cell data (first read data) and the neighbor cell data (second read data), and adjust the LLR value based on the compensation value. Alternatively, the controller 100 may generate the compensation value based on a pattern of the victim cell data and the neighbor cell data and the number of unsatisfied checks connected to bit values of the victim cell data.

In various embodiments, the controller 100 may adjust the LLR value by adding the compensation value to the LLR value. Alternatively, the controller 100 may adjust the LLR value by multiplying the LLR value by the compensation value.

At step 1270, the controller 100 may perform a decoding operation on the victim cell data using the adjusted LLR value. At step 1280, the controller 100 may determine whether the decoding operation of step 1270 succeeded or failed. If it is determined that the decoding operation of step 1270 succeeded (1280, YES), the controller 100 may proceed to step 1240. At step 1240, the controller 100 may transmit the victim cell data to a host (e.g., the host 5 of FIG. 1).

If it is determined that the decoding operation of step 1270 did not succeed (1280, NO), the controller 100 may proceed to step 1290. At step 1290, the controller 100 may determine whether the adjusting of the LLR value has been performed a maximum number of times represented by a maximum iteration number. If it is determined that the adjusting of the LLR value has not performed the maximum number of times, the controller 100 may return to step 1260. If it is determined that the adjusting of the LLR value has been performed the maximum number of times, the controller 100 pray proceed to step 1295.

At step 1295, the controller 100 may perform one or more other error recovery operations. For example, other error recovery operations may include a soft decoding operation based on a low density parity check (LDPC) code that is performed when a hard decoding operation based on the LDPC code fails and a chipkill operation that is performed when a soft decoding operation based on the LDPC code fails.

As described above, the memory system in accordance with embodiments provides a neighbor assisted correction (NAC) error recovery scheme using adjusted LLR values. Thus, the NAC error recovery scheme uses more accurate LLR values, and thus improves the error correction capability. Further, the NAC error recovery scheme is triggered, based on condition(s) that ensure that the NAC will really help, for example, when a retention time of data is high or neighbor cell data is already stored in a buffer. Thus, the NAC error recovery scheme reduces error recovery latency.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the claims.

What is claimed is:

1. A system comprising:
a memory device including a plurality of cells; and
a controller suitable for:
performing a read on a cell among the plurality of cells; and
adjusting a log-likelihood ratio (LLR) value on the cell to generate an adjusted LLR value, based on first read data on the cell and second read data on at least one neighbor cell adjacent to the cell, when the read on the cell fails.

2. The system of claim 1, wherein the controller performs a decoding operation on the first read data using the adjusted LLR value.

3. The system of claim 1, wherein each of the plurality of cells includes one of a triple-level cell (TLC) and a quadruple-level cell (QLC).

4. The system of claim 1, wherein the at least one neighbor cell includes at least one of an upper cell and a lower cell, which are adjacent to the cell, and
wherein the at least one upper cell and lower cell and the cell share a same bit line, and word lines of the upper cell, the lower cell and the cell are adjacent to each other.

5. The system of claim 1, wherein the controller includes:
an LLR value generator suitable for generating the LLR value on the cell; and
an LLR value adjuster suitable for:
receiving the LLR value;
generating a compensation value using the first read data and the second read data; and
adjusting the LLR value based on the compensation value to generate the adjusted LLR value.

6. The system of claim 5, wherein the LLR value adjuster includes:
a compensation value generator suitable for receiving the first read data and the second read data, and generating the compensation value based on a data pattern of the first read data and the second read data; and
an adjusting component suitable for receiving the LLR value, and adjusting the LLR value based on the compensation value to generate the adjusted LLR value.

7. The system of claim 6, wherein the compensation value generator generates the compensation value based on a data pattern of the first read data and the second read data and the number of unsatisfied checks connected to each bit values of the first read data.

8. The system of claim 6, wherein the adjusting component generates the adjusted LLR value by adding the compensation value to the LLR value.

9. The system of claim 6, wherein the adjusting component generates the adjusted LLR value by multiplying the LLR value by the compensation value.

10. The system of claim 1, wherein the controller includes a buffer for storing the second read data, and
the controller performs the adjusting of the LLR value when the second read data is stored in the buffer or a retention time of the first read data is high.

11. A method for operating a memory system including a memory device including a plurality of cells, the method comprising:
performing a read on a cell among the plurality of cells; and
when the read on the cell fails, adjusting a log-likelihood ratio (LLR) value on the cell to generate an adjusted LLR value, based on first read data on the cell and second read data on at least one neighbor cell adjacent to the cell.

12. The method of claim 11, further comprising: performing a decoding operation on the first read data using the adjusted LLR value.

13. The method of claim 11, wherein each of the plurality of cells includes one of a triple-level cell (TLC) and a quadruple-level cell (QLC).

14. The method of claim 11, wherein the at least one neighbor cell includes at least one of an upper cell and a lower cell, which are adjacent to the cell, and wherein the at least one upper cell and lower cell and the cell share a same bit line, and word lines of the upper cell, the lower cell and the cell are adjacent to each other.

15. The method of claim 11, wherein the adjusting of the LLR value includes:
generating an LLR value on the cell;
generating a compensation value using the first read data and the second read data; and
adjusting the LLR value based on the compensation value to generate the adjusted LLR value.

16. The method of claim 15, wherein the generating of the compensation value includes:
generating the compensation value based on a data pattern of the first read data and the second read data.

17. The method of claim 16, wherein the generating of the compensation value includes:
generating the compensation value based on a data pattern of the first read data and the second read data and the number of unsatisfied checks connected to each bit values of the first read data.

18. The method of claim 16, wherein the adjusting of the value of the LLR includes adding the compensation value to the LLR value.

19. The method of claim 16, wherein the adjusting of the value of the LLR includes multiplying the LLR value by the compensation value.

20. The method of claim 11, wherein the adjusting of the LLR value is performed when the second read data is stored in a buffer or a retention time of the first read data is high.

* * * * *